(12) United States Patent
Otsuka

(10) Patent No.: US 11,824,140 B2
(45) Date of Patent: *Nov. 21, 2023

(54) METHOD OF MANUFACTURING NITRIDE SEMICONDUCTOR LIGHT EMITTING ELEMENT

(71) Applicant: NICHIA CORPORATION, Anan (JP)

(72) Inventor: Takumi Otsuka, Anan (JP)

(73) Assignee: NICHIA CORPORATION, Anan (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/679,559

(22) Filed: Feb. 24, 2022

(65) Prior Publication Data

US 2022/0181523 A1 Jun. 9, 2022

Related U.S. Application Data

(60) Division of application No. 17/014,859, filed on Sep. 8, 2020, now Pat. No. 11,302,847, which is a
(Continued)

(30) Foreign Application Priority Data

Mar. 28, 2018 (JP) ................. 2018-062835

(51) Int. Cl.
*H01L 33/00* (2010.01)
*H01L 33/40* (2010.01)
(Continued)

(52) U.S. Cl.
CPC .......... *H01L 33/40* (2013.01); *H01L 33/0075* (2013.01); *H01L 33/32* (2013.01); *H01L 33/42* (2013.01); *H01L 2933/0016* (2013.01)

(58) Field of Classification Search
CPC ..... H01L 33/40; H01L 33/0075; H01L 33/32; H01L 33/42; H01L 2933/0016
See application file for complete search history.

(56) References Cited

U.S. PATENT DOCUMENTS

2006/0214574 A1 9/2006 Kawaguchi et al.
2008/0006846 A1 1/2008 Ikeda et al.
(Continued)

FOREIGN PATENT DOCUMENTS

CN 101138074 A 3/2008
JP H10-022494 A 1/1998
(Continued)

OTHER PUBLICATIONS

Ex Parte Quayle Action in U.S. Appl. No. 16/367,170 dated Mar. 20, 2020.
(Continued)

*Primary Examiner* — Samuel A Gebremariam
(74) *Attorney, Agent, or Firm* — Foley & Lardner LLP

(57) ABSTRACT

A method of manufacturing a nitride semiconductor light-emitting element configured to emit deep ultraviolet light includes: providing a semiconductor structure comprising:

an n-side semiconductor layer comprising an n-side contact layer comprising aluminum, gallium, and nitrogen, a p-side semiconductor layer, and an active layer between the n-side semiconductor layer and the p-side semiconductor layer; forming an n-side electrode, which comprises forming, successively from an n-side contact layer side: a first layer located above the n-side contact layer and comprising a titanium layer, a second layer located above the first layer and comprising a silicon-containing aluminum alloy layer, and a third layer located above the second layer and comprising a tantalum layer and/or a tungsten layer; and heating the n-side electrode.

13 Claims, 2 Drawing Sheets

Related U.S. Application Data continuation of application No. 16/367,170, filed on Mar. 27, 2019, now Pat. No. 10,804,434.

(51) Int. Cl.
*H01L 33/32* (2010.01)
*H01L 33/42* (2010.01)

(56) References Cited

U.S. PATENT DOCUMENTS

| | | |
|---|---|---|
| 2010/0308366 A1 | 12/2010 | Kang et al. |
| 2012/0049232 A1 | 3/2012 | Okabe et al. |
| 2012/0199861 A1 | 8/2012 | Tsuji |
| 2012/0299038 A1 | 11/2012 | Hwang et al. |
| 2013/0069095 A1 | 3/2013 | Hodota |
| 2014/0021442 A1 | 1/2014 | Inazu et al. |
| 2015/0349209 A1 | 12/2015 | Nagamatsu et al. |

FOREIGN PATENT DOCUMENTS

| | | |
|---|---|---|
| JP | 2006-059933 A | 3/2006 |
| JP | 2006-269912 A | 10/2006 |
| JP | 2007-081400 A | 3/2007 |
| JP | 2008-041866 A | 2/2008 |
| JP | 2010-267797 A | 11/2010 |
| JP | 2011-066073 A | 3/2011 |
| JP | 2012-142401 A | 7/2012 |
| JP | 2012-164930 A | 8/2012 |
| JP | 2015-225915 A | 12/2015 |
| JP | 2016-066691 A | 4/2016 |
| JP | 2017-139447 A | 8/2017 |
| WO | WO-2011/162367 A1 | 12/2011 |
| WO | WO-2012/144046 A1 | 10/2012 |

OTHER PUBLICATIONS

Notice of Allowance on in U.S. Appl. No. 16/367,170 dated Jun. 4, 2020.

Notice of Allowance on in U.S. Appl. No. 16/367,170 dated Jul. 21, 2020.

METHOD OF MANUFACTURING NITRIDE SEMICONDUCTOR LIGHT EMITTING ELEMENT

CROSS-REFERENCE TO RELATED APPLICATIONS

The present application is a divisional of U.S. patent application Ser. No. 17/014,859, filed on Sep. 8, 2020, which claims priority to U.S. patent application Ser. No. 16/367,170, filed on Mar. 27, 2019 (U.S. Pat. No. 10,804,434, issued on Oct. 13, 2020), and Japanese Patent Application No. 2018-062835, filed on Mar. 28, 2018, the disclosures of which are hereby incorporated by reference in their entireties.

BACKGROUND

The present disclosure relates to a nitride semiconductor light emitting element.

A mercury lamp that emits deep ultraviolet light is widely used in industrial applications such as ultraviolet curing and the like, environmental protection applications such as sterilization of water and the like, and medical applications such as sterilization of surgical equipment. In recent years, however, there have been concerns of the adverse effect of mercury on the human body, creating growing demand for a nitride semiconductor light emitting element that emits deep ultraviolet light as an alternative means.

For a semiconductor light emitting element, it is preferable to lower the forward voltage Vf in order to effectively utilize the electrical energy provided, and this can improve the emission efficiency of the semiconductor light emitting element. As a way to lower the forward voltage Vf, allowing for ohmic contact between an n-side contact layer and an n-electrode is effective, and Japanese Unexamined Patent Application Publication No. 2006-59933, for example, discloses an AlGaN layer containing Al, Ga, and N as the n-side contact layer of a nitride semiconductor light emitting element.

SUMMARY

Despite a broad range of studies having been conducted, including the technique described above, as things stand, it is difficult to achieve ohmic contact between an n-side contact layer and an n-electrode in the deep ultraviolet wavelength range.

Accordingly, one object of certain embodiments described in the present disclosure is to provide a nitride semiconductor light emitting element capable of achieving good ohmic contact between an n-side contact layer and an n-electrode in the deep ultraviolet wavelength range.

According to one embodiment, a nitride semiconductor light emitting element is configured to emit light in the deep ultraviolet wavelength range and comprises an n-side contact layer containing Al, Ga, and N, and an n-electrode disposed on the contact layer, wherein the n-electrode includes, successively from the n-side contact layer side, a first layer, which is a Ti layer, a second layer, which is a Si-containing Al alloy layer, and a third layer, which is at least one of Ta layer and W layer.

The nitride semiconductor light emitting element according to certain embodiments has good ohmic contact between the n-side contact layer and the n-electrode.

The present inventors conducted various studies in order to solve the problems described above. First, in order to obtain a nitride semiconductor light emitting element that emits light in the deep ultraviolet wavelength range (for example, 350 nm at most), a layer containing Al, Ga, and N (hereinafter referred to as an "AlGaN layer") was used as the n-side contact layer, and the Vf was measured by varying the Al content. As a result, the present inventors learned that increasing of the ratio of the Al content to the Ga content can attenuate self-absorption in the AlGaN layer to thereby increase the light extraction efficiency, but makes it difficult to achieve ohmic contact between the n-side contact layer and the n-electrode (hereinafter, simply referred to as "ohmic contact" on occasion).

The present inventors further studied by focusing on the structure of the n-electrode. As a result, the present inventors found that forming an n-electrode by successively including, from the n-side contact layer side, a first layer, which is a Ti layer, a second layer, which is a Si-containing Al alloy layer, and a third layer, which is at least one of Ta layer and W layer, can achieve good ohmic contact while increasing the light extraction efficiency.

The present invention was created based on the findings described above that were independently acquired by the present inventors.

A nitride semiconductor light emitting element according to one embodiment of the invention will be explained below with reference to the drawings. The embodiment explained below, however, is for giving shape to the technical ideas of the present invention, and is not intended to limit the present invention. The drawings referenced in the explanation below are schematic illustrations of the embodiment of the present invention. As such, the relative sizes, spacing and positional relationships between the members may be exaggerated, or portions of certain members may be omitted.

Figure 1:
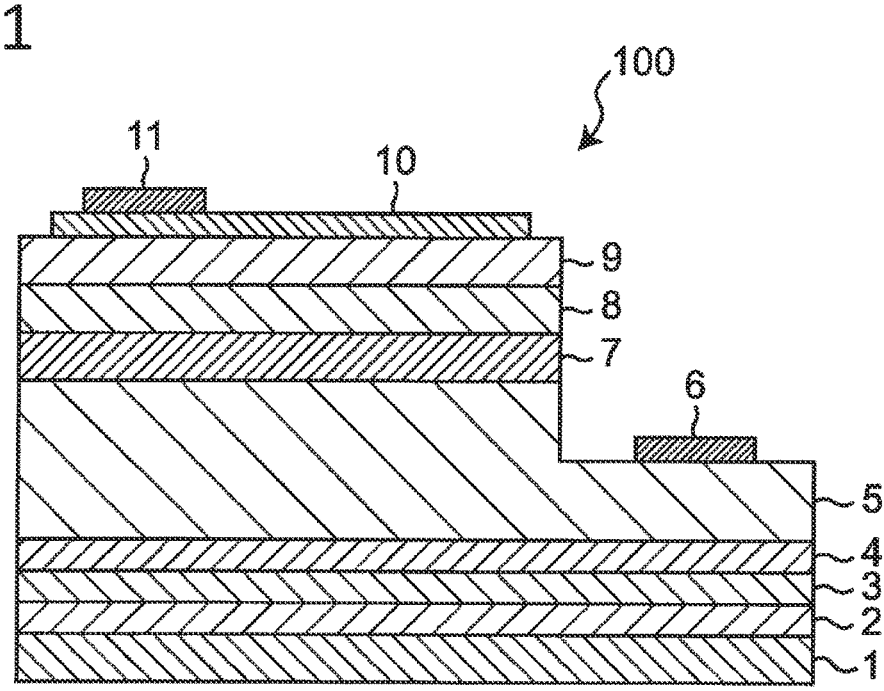
FIG. 1 is a schematic cross-sectional view of the nitride semiconductor light emitting element according to one embodiment of the present invention.

The structure of the nitride semiconductor light emitting element according to the embodiment of the present invention will be explained first. FIG. 1 is a schematic cross-sectional view of the nitride semiconductor light emitting element according to the embodiment of the present invention. The nitride semiconductor light emitting element 100 according to the embodiment of the present invention includes a substrate 1, a buffer layer 2, a superlattice 3, n-side nitride semiconductor layers, an n-electrode 6, an active layer 7, p-side nitride semiconductor layers, a p-contact electrode 10, and a p-electrode 11. The n-side nitride semiconductor layers include an undoped layer 4 and an n-side contact layer 5, and the n-electrode 6 is disposed on the n-side contact layer 5. The p-side nitride semiconductor layers include a p-side clad layer 8 and a p-side contact layer 9.

Each element will be explained in detail below.

Substrate 1

For the substrate 1, insulating substrates such as spinel ($MgAl_2O_4$) and the like; C-plane, R-plane and A-plane sapphire substrates; and semiconductor substrates such as SiC, ZnS, ZnO, GaAs, GaN, and the like can be used.

Buffer Layer 2 and Superlattice 3

The buffer layer 2 and the superlattice 3 are layers that relax the strain induced stress caused by the lattice constant difference between the substrate 1 and the n-nitride semiconductor layer, or the like. The buffer layer 2 is disposed on the substrate 1, and the superlattice 3 is further disposed on the buffer layer 2. For the buffer layer 2, a layer made of AlN, for example, can be used. For the superlattice 3, one made of AlGaN and AlN layers can be used.

N-Side Nitride Semiconductor Layers

The n-side nitride semiconductor layers include an undoped layer 4 and an n-side contact layer 5.

Undoped Layer 4

The undoped layer 4 is a pit-burying layer for reducing the pits occurring in the superlattice 3, and may be, for example an AlGaN layer formed to a thickness of, for example, 3 μm.

N-Side Contact Layer 5

The n-side contact layer 5 is an AlGaN layer containing Al, Ga, and N. The ratio of the Al content to the Ga content can be suitably adjusted by taking other components into consideration so that the nitride semiconductor light emitting element can emit light in the deep ultraviolet range. In order to increase the light extraction efficiency by attenuating self-absorption in the AlGaN layer, the ratio of the Al content to the Ga content is preferably high, and the n-side contact layer 5 is particularly preferably an $Al_xGa_{1-x}N$ ($0.5 \leq X < 1$) layer.

N-Electrode 6

Figure 2:
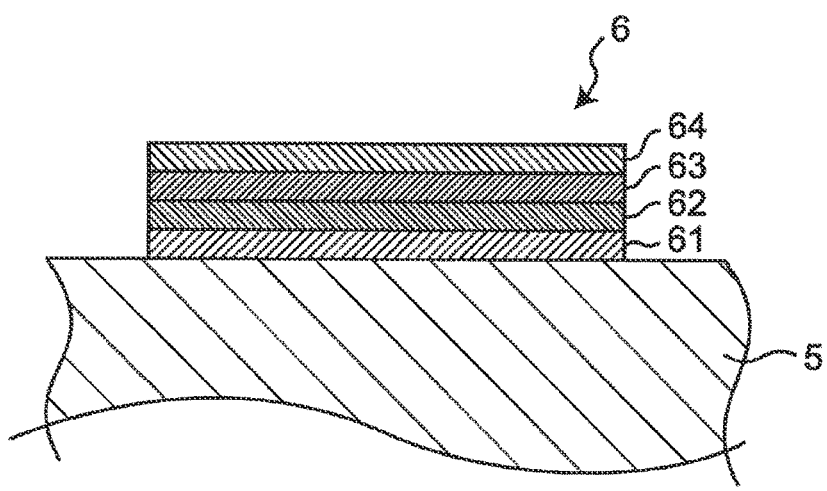
FIG. 2 is a schematic cross-sectional view of the n-electrode disposed on the nitride semiconductor light emitting element according to the embodiment of the present invention.

FIG. 2 is a schematic cross-sectional view of the n-electrode 6 disposed on the nitride semiconductor light emitting element according to the embodiment of the present invention. The n-electrode 6 successively includes from the n-side contact layer 5 side a first layer 61, which is a Ti layer, a second layer 62, which is a Si-containing Al alloy layer, a third layer 63, which is a Ta layer and/or a W layer, and a fourth layer 64, which is composed of at least one of Ti layer and Ru layer.

First Layer: Ti Layer and Second Layer: Si-Containing Al Alloy Layer

On the n-side contact layer 5, a first layer 61, which is a Ti layer, and a second layer 62, which is a Si-containing Al alloy layer, are successively disposed from the n-side contact layer 5 side. With such a layer structure, the contact resistance between the n-side contact layer 5 and the n-electrode 6 (hereinafter, simply referred to as "contact resistance" on occasion) is reduced to achieve good ohmic contact.

In order to further attenuate an increase in Vf, the thickness of the Ti layer is preferably at least 20 nm, but 30 nm at most, and the Si-containing Al alloy layer preferably contains 10 percent by mass to 25 percent by mass, more preferably 15 percent by mass to 20 percent by mass of Si relative to the sum of Al and Si.

The Ti layer is a layer consisting essentially of Ti, but may contain trace amounts of elements other than Ti to the extent that they do not hinder the objective of the present invention.

The Si-containing Al alloy layer is a layer made of an Al alloy consisting essentially of Al and Si, but may contain trace amounts of elements other than Al and Si to the extent that they do not hinder the objective of the present invention.

Third Layer: At Least One of Ta Layer and W Layer

On the second layer 62, a third layer 63 made of at least one of Ta layer and W layer is disposed. The third layer 63 works to attenuate diffusion of Al in the Si-containing Al alloy layer during a heat treatment in the manufacturing process for the nitride semiconductor light emitting element, achieving good ohmic contact. Even in the case of disposing a fourth layer 64 made of at least one of Ti layer and Ru layer on the third layer 63 as described later, the third layer 63 similarly works to attenuate diffusion of Ti in the Ti layer and Ru in the Ru layer, achieving good ohmic contact.

The third layer 63 may be composed of a Ta layer singly, a W layer singly, or both Ta and W layers. That is, the third layer 63 is one of: (a) a Ta layer, (b) a W layer, (c) a Ta layer and a W layer on the Ta layer, and (d) a W layer and a Ta layer on the W layer.

In order to achieve better ohmic contact, the thickness of the Ta layer is preferably at least 300 nm, and at most 500 nm. The thickness of the W layer is preferably at least 300 nm, and at most 500 nm.

The Ta layer is a layer consisting essentially of Ta, but may contain trace amounts of elements other than Ta to the extent that they do not hinder the objective of the present invention.

The W layer is a layer consisting essentially of W, but may contain trace amounts of elements other than W to the extent that they do not hinder the objective of the present invention.

The third layer 63 works as a barrier layer against the etching solution used during etching in the manufacturing process for the nitride semiconductor light emitting element, attenuating the corrosion of the first layer 61 and the second layer 62 disposed under the third layer 63. Since the Ta layer is superior to the W layer in terms of corrosion resistance, the third layer 63 is preferably (a), (c), or (d), which all include a Ta layer, more preferably (a), which is a Ta layer employed singly.

Fourth Layer: At Least One of Ti Layer and Ru Layer

In is preferable to dispose a fourth layer 64 that is at least one of Ti layer and Ru layer on the third layer 63. The fourth layer 64 can attenuate oxidation of the third layer 63.

The fourth layer can take the form of being composed of a Ti layer singly, a Ru layer singly, or both Ti and Ru layers. That is, the third layer 64 is one of: (e) a Ti layer, (f) a Ru layer, (g) a Ti layer and a Ru layer on the Ti layer, and (h) a Ru layer and a Ti layer on the Ru layer.

The Ti layer is a layer consisting essentially of Ti, but may contain trace amounts of elements other than Ti to the extent that they do not hinder the objective of the present invention.

The Ru layer is a layer consisting essentially of Ru, but may contain trace amounts of elements other than Ru to the extent that they do not hinder the objective of the present invention.

Between two adjacent layers among the first layer 61 to the fourth layer 64, i.e., a Ti layer, a Si-containing Al alloy layer, at least one of a Ta layer and a W layer, and at least one of a Ti layer and a Ru layer, there may be interposed an alloyed portion, in which the chemical components of the two layers are alloyed. An alloyed portion may be interposed between two adjacent layers across the interface in part or whole. In an example of the alloyed portion formed between two adjacent layers, a Si-containing Al alloy layer is stacked on a Ti layer and when subsequently subjected to a heat treatment in the manufacturing process for the nitride semiconductor light emitting element, the portions of the Ti layer and the Al alloy layer that are in contact are alloyed.

Active Layer 7

The active layer 7 is, for example, of a multi-quantum-well structure where well layers and buffer layers are alternately stacked, and the well layers and the buffer layers are made of, for example, AlGaN layers whose compositions are controlled in accordance with light having a desired emission wavelength.

The well layers and the buffer layers can be structured, for example, with a Group III nitride expressed by the general formula, $In_aAl_bGa_{1-a-b}N$ ($0 \leq a \leq 0.1$, $0.4 \leq b \leq 1.0$, $a+b \leq 1.0$). In the case of producing a nitride semiconductor light emitting element that emits deep ultraviolet light having a peak wavelength of 280 nm, for example, the well layers can be structured with a nitride semiconductor having an Al content b of 0.45, i.e., $Al_{0.45}Ga_{0.55}N$. In this case, the buffer layers can be constructed with a nitride semiconductor having an Al content b of 0.56, i.e., $Al_{0.56}Ga_{0.44}N$.

P-Side Nitride Semiconductor Layers

The p-side nitride semiconductor layers include a p-side clad layer 8 and a p-side contact layer 9.

P-Side Clad Layer 8

The p-side clad layer 8 is a p-side buffer layer for blocking electrons, and made of an Mg-doped AlGaN layer having a thickness of, for example, 10 nm to 30 nm.

P-Side Contact Layer 9

The p-side contact layer 9 is a layer on which a p-contact electrode 10 is disposed, and made of, for example, an Mg-doped GaN layer.

P-Contact Electrode 10

The p-contact electrode 10 is made of, for example, a transparent electrode such as ITO, and light is released via the p-contact electrode 10.

P-Electrode 11

The p-electrode 11 is not particularly limited, and may be structured, for example, by stacking Ti, Rh, and Ti layers. From the perspective of shortening the electrode forming step, the same material as that for the n-electrode 6 can be used.

The method for manufacturing a nitride semiconductor light emitting element according to the embodiment of the present invention is not particularly limited, and any known method can be used. Examples of forming methods for the n-electrode 6, the p-contact electrode 10, and the p-electrode 11 include vapor deposition and sputtering. Examples of forming methods for the buffer layer 2, the superlattice 3, the n-side nitride semiconductor layers, the active layer 7, and the p-side nitride semiconductor layers include organometallic vapor phase epitaxy (MOCVD).

EXAMPLES

Analysis of Diffusion of Elements Composing the N-Electrode 6

A sapphire substrate 1 was placed in a MOCVD apparatus, and on the sapphire substrate 1, a buffer layer 2, a superlattice 3 composed of AlGaN and AlN, n-side semiconductor layers (an undoped layer 4 made of AlGaN and an n-side contact layer 5 made of $Al_{0.60}Ga_{0.40}N$), an active layer 7, and p-side semiconductor layers (a p-side clad layer 8 made of Mg-doped AlGaN layer, and a p-side contact layer 9 made of Mg-doped GaN layer) were allowed to grow in that order.

Next, a mask having a prescribed shape was formed on the surface of the p-side semiconductor layers, and the n-side contact layer 5 was exposed by removing the p-side semiconductor layers and the active layer 7 by etching.

Then an n-electrode 6 was formed on the n-side contact layer 5 by sputtering.

Specifically, successively from the n-side contact later 5 side, a first layer 61, which is a Ti layer (thickness: 25 nm), a second layer 62, which is a Si-containing Al alloy layer (thickness: 100 nm), a third layer 63, which is a Ta layer (thickness: 500 nm), and a fourth layer, which is a Ru layer and a Ti layer on the Ru layer (thickness of the Ru layer: 30 nm, thickness of the Ti layer: 10 nm) were formed. Subsequently, an annealing process was performed at 800° C. for one minute.

Next, a p-contact electrode 10 made of ITO (thickness: 1700 Å) was formed on the p-side contact layer 9 by sputtering, and an annealing process was performed.

Next, a p-electrode 11 was formed on the p-contact electrode 10 by sputtering. Specifically, successively from the p-contact electrode 10 side, a Ti layer (thickness: 15 Å), a Rh layer (thickness: 5000 Å), and a Ti layer (thickness: 100 Å) were formed.

Next, a protective film made of $SiO_2$ (thickness: 700 nm) was formed so as to cover, excluding a portion of the upper surface of the n-electrode 6 and a portion of the upper surface of the p-electrode 11, the surfaces of the buffer layer 2, the superlattice 3, the n-side semiconductor layers, the active layer 7, the p-side semiconductor layers, and the p-contact electrode 10, i.e., substantially the entire nitride semiconductor light emitting element 100.

Next, eutectic PN pads are formed to cover the portions of the upper surfaces of the n-electrode 6 and the p-electrode 11 described above. Specifically, successively from the sapphire substrate 1 side, a Ti layer (thickness: 2000 Å), a Pt layer (thickness: 2000 Å), and an Au layer (thickness: 5000 Å) were formed.

By following the manufacturing process described above, the nitride semiconductor light emitting element 100 of Example 1 was manufactured.

Then the diffusion of each element structuring the n-electrode 6 was analyzed before and after a heat treatment by using GDS (glow discharge spectrometer) equipment.

The GDS equipment analyzes the diffusion of elements by following (1) a process of generating stable glow discharge plasma by supplying power between the opposing electrodes, a hollow anode and a sample (cathode), while maintaining the discharge part in an argon ambience, (2) a process of exciting the atoms on the sample surface uniformly sputtered with argon ions from the surface and generating element-specific spectra, (3) a process of separating and measuring the spectra to thereby obtain element concentration from luminous intensity and depth information from the sputtering duration, and (4) a process of analyzing the directions of depths from the surface.

Figure 3:
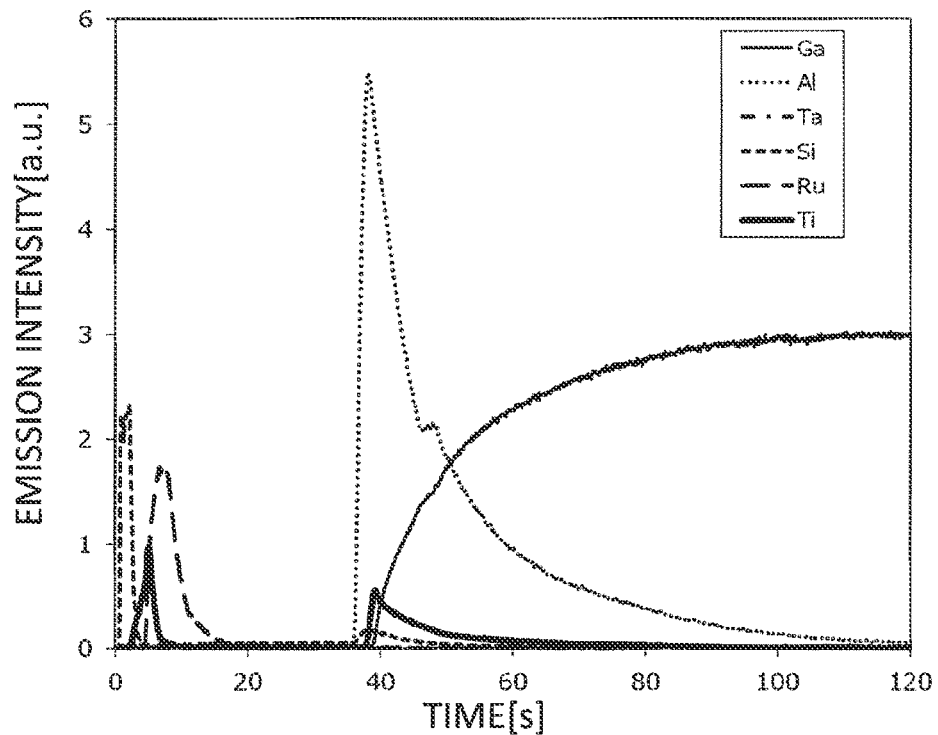
FIG. 3 is a graph showing the emission intensity of each element structuring the n-electrode 6 prior to a heat treatment.

FIG. 3 is a graph showing the diffusion of the elements composing the n-electrode 6 before a heat treatment. This shows that all elements composing the n-electrode 6 were stable, not diffused, before the heat treatment.

Figure 4:
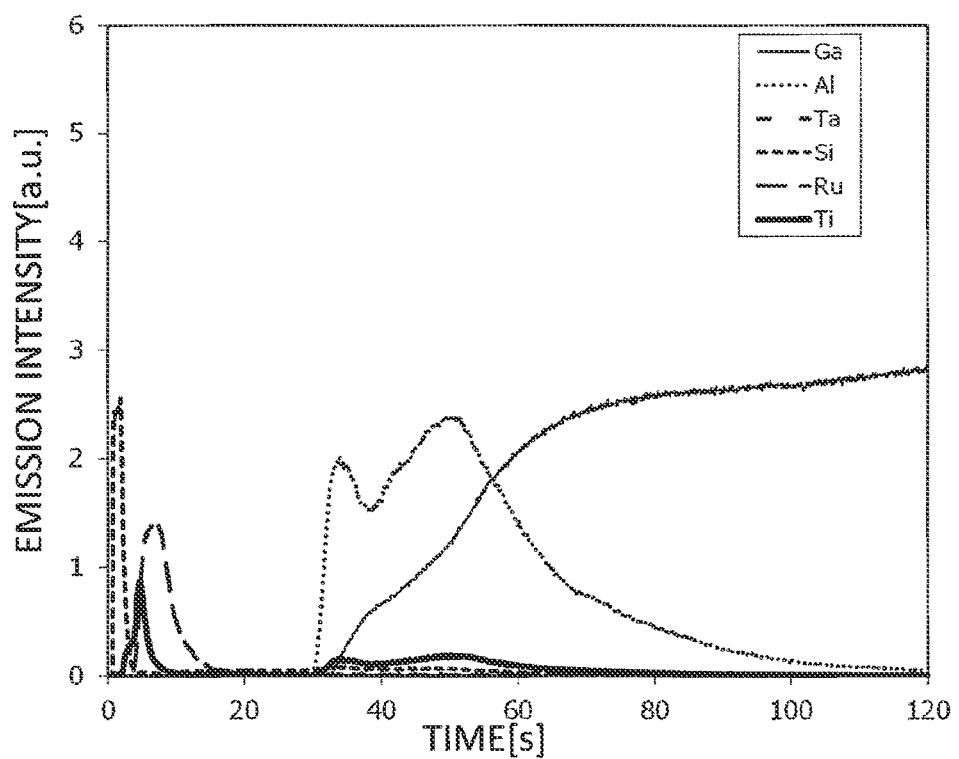
FIG. 4 is a graph showing the emission intensity of each element structuring the n-electrode 6 after being subjected to a heat treatment at 800° C. for one minute.

FIG. 4 is a graph showing the diffusion of the elements composing the n-electrode 6 after subjecting the nitride semiconductor light emitting element 100 to a heat treatment at 800° C. for one minute. This shows that mutual diffusion of elements between the layers was under control during the heat treatment.

Measurement of Contact Resistance and Vf (1) Changing the Thickness of the Ti Layer and the Al Content of the N-Side Contact Layer Nitride semiconductor light emitting elements 100 of Examples 2 to 9 were manufactured in a similar manner as in Example 1 except for varying the Al content of the n-side contact layer 5 and the thickness of the first layer 61, which is a Ti layer, as shown in Tables 1 and 2 below.

Moreover, a nitride semiconductor light emitting element 100 of Comparative Example 1 was manufactured in a similar manner to in Example 1 except for not forming a second layer 62, which is a Si-containing Al ally layer.

With respect to the nitride semiconductor light emitting elements 100 of Examples 2 to 8 and the Comparative Example 1, contact resistance was measured. The contact resistance of each nitride semiconductor light emitting element was measured three times, and the average was obtained.

Moreover, with respect to the nitride semiconductor light emitting elements 100 of Examples 2, 5, 6, and 9, Vf at 350 mA forward current was measured. The measurement of Vf of each nitride semiconductor light emitting element was performed five times, and the average was obtained.

Table 1 and 2 show the contact resistance and Vf measurements, respectively. In Table 1, "E-1" and "E-4" mean "$\times 10^{-1}$" and "$\times 10^{-4}$," respectively.

TABLE 1

| | Ti-layer (First Layer) Thickness (Å) | N-type contact layer $Al_xGa_{1-x}N$ Al Content x | Contact Resistance ($\Omega \cdot cm^2$) |
| --- | --- | --- | --- |
| Example 2 | 130 | 0.62 | 5.55E−04 |
| Example 3 | 190 | 0.63 | 5.94E−04 |
| Example 4 | 250 | 0.55 | 1.52E−04 |
| Example 5 | 250 | 0.60 | 6.85E−04 |
| Example 6 | 250 | 0.62 | 7.69E−04 |
| Example 7 | 250 | 0.63 | 3.55E−04 |
| Example 8 | 375 | 0.55 | 5.32E−04 |
| Comparative Example 1 | 250 (AlSi-less) | 0.55 | 1.42E−01 |

TABLE 2

| | Ti-layer (First Layer) Thickness (Å) | N-type contact layer $Al_xGa_{1-x}N$ Al Content x | Vf (V) At 350 mA Forward Current |
| --- | --- | --- | --- |
| Example 2 | 130 | 0.62 | 5.46 |
| Example 5 | 250 | 0.60 | 5.47 |
| Example 6 | 250 | 0.62 | 5.39 |
| Example 9 | 190 | 0.62 | 5.55 |

As shown in Table 1, Examples 2 to 8 had low contact resistance, and were able to achieve good ohmic contact. As shown in Table 2, Examples 2, 5, 6, and 9 were able to maintain a low Vf.

On the other hand, the Comparative Example 1, which had no second layer 62, which is a Si-containing Al alloy layer, had an extremely high contact resistance, and could not achieve ohmic contact.

(2) Changing the Thickness of the Ti Layer and the Al Content of the N-side Contact Layer Nitride semiconductor light emitting elements 100 of Examples 10-12 were manufactured in a similar manner to in Example 1 except for changing the composition of the second layer 62, which is a Si-containing Al alloy layer, changing the third layer 63 to a W layer (thickness: 500 nm), and changing the fourth layer 64 to a Ru layer (thickness: 30 nm).

With respect to the nitride semiconductor light emitting elements 100 of Examples 10 to 12, contact resistance and Vf at 350 mA forward current were measured.

Table 3 shows the contact resistance and Vf measurements. In Table 3, "E-4" means "$\times 10^{-4}$." In Table 3, the ratio of Si to the sum of Al and Si in the Si-containing Al layer is shown as "Si Ratio."

TABLE 3

| | Si Ratio (mass %) | Contact Resistance ($\Omega \cdot cm^2$) | Vf (V) at 350 mA Forward Current |
| --- | --- | --- | --- |
| Example 10 | 5 | 2.26E−04 | 5.03 |
| Example 11 | 15 | 1.68E−04 | 4.92 |
| Example 12 | 30 | 1.90E−04 | 5.00 |

As shown in Table 3, Examples 10 to 12 had low contact resistance, were able to achieve good ohmic contact, and were able to maintain low Vf.

What is claimed is:

1. A nitride semiconductor light emitting element configured to emit deep ultraviolet light, the light emitting element comprising:
    an n-side contact layer comprising aluminum, gallium, and nitrogen; and an n-electrode located on the n-side contact layer and comprising:
        a first portion formed by alloying a part of a titanium layer and a part of a silicon-containing aluminum alloy layer, and
        a second portion comprising at least one of a tantalum layer and/or a tungsten layer;
    wherein the first portion is located between the n-side contact layer and the second portion.

2. The nitride semiconductor light emitting element according to claim 1, wherein the n-side contact layer consists essentially of $Al_xGa_{1-x}N$ ($0.5 \leq x \leq 1$).

3. The nitride semiconductor light emitting element according to claim 1, wherein a thickness of the tantalum layer or tungsten layer is at least 300 nm, and at most 500 nm.

4. The nitride semiconductor light emitting element according to claim 2, wherein a thickness of the tantalum layer or tungsten layer is at least 300 nm, and at most 500 nm.

5. The nitride semiconductor light emitting element according to claim 1, wherein the n-side electrode further comprises a third portion located above the second portion and comprising a titanium layer and/or a ruthenium layer.

6. The nitride semiconductor light emitting element according to claim 2, wherein the n-side electrode further comprises a third portion located above the second portion and comprising a titanium layer and/or a ruthenium layer.

7. The nitride semiconductor light emitting element according to claim 3, wherein the n-side electrode further comprises a third portion located above the second portion and comprising a titanium layer and/or a ruthenium layer.

8. The nitride semiconductor light emitting element according to claim 4, wherein the n-side electrode further comprises a third portion located above the second portion and comprising a titanium layer and/or a ruthenium layer.

9. The nitride semiconductor light emitting element according to claim 1 further comprising:
    a p-side contact layer,
    a p-side contact electrode located on the p-side contact layer and comprising ITO, and
    a p-electrode comprising a titanium layer and a ruthenium layer.

10. The nitride semiconductor light emitting element according to claim 2 further comprising:
  a p-side contact layer,
  a p-side contact electrode located on the p-side contact layer and comprising ITO, and
  a p-electrode comprising a titanium layer and a ruthenium layer.

11. The nitride semiconductor light emitting element according to claim 3 further comprising:
  a p-side contact layer,
  a p-side contact electrode located on the p-side contact layer and comprising ITO, and
  a p-electrode comprising a titanium layer and a ruthenium layer.

12. The nitride semiconductor light emitting element according to claim 4 further comprising:
  a p-side contact layer,
  a p-side contact electrode located on the p-side contact layer and comprising ITO, and
  a p-electrode comprising a titanium layer and a ruthenium layer.

13. The nitride semiconductor light emitting element according to claim 5 further comprising:
  a p-side contact layer,
  a p-side contact electrode located on the p-side contact layer and comprising ITO, and
  a p-electrode comprising a titanium layer and a ruthenium layer.

\* \* \* \* \*